(12) United States Patent
Efland

(10) Patent No.: US 6,597,065 B1
(45) Date of Patent: Jul. 22, 2003

(54) THERMALLY ENHANCED SEMICONDUCTOR CHIP HAVING INTEGRATED BONDS OVER ACTIVE CIRCUITS

(75) Inventor: Taylor R. Efland, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/002,022

(22) Filed: Oct. 31, 2001

Related U.S. Application Data

(60) Provisional application No. 60/246,081, filed on Nov. 3, 2000.

(51) Int. Cl.$^7$ .......................... H01L 23/34; H01L 29/40
(52) U.S. Cl. ...................... 257/712; 257/781; 257/784; 257/691
(58) Field of Search ................................ 257/712, 781, 257/784, 691, 778

(56) References Cited

U.S. PATENT DOCUMENTS

| | | | | |
|---|---|---|---|---|
| 4,259,685 A | * | 3/1981 | Romano | 257/726 |
| 4,346,396 A | * | 8/1982 | Carroll et al. | 257/675 |
| 4,518,982 A | * | 5/1985 | Du Bois et al. | 257/796 |
| 5,610,442 A | * | 3/1997 | Schneider et al. | 257/706 |
| 5,753,974 A | * | 5/1998 | Masukawa | 257/737 |
| 6,075,289 A | * | 6/2000 | DiStefano | 257/732 |

OTHER PUBLICATIONS

"Controlled Collapse Reflow Chip Joining", L. F. Miller, IBM J. Res. Develop., vol. 13, May 1969, pp. 239–250.

"Geometric Optimization of Controlled Collapse Interconnections", L. S. Goldlman, IBM j. Res. Develop., vol. 13, May 1969, pp. 251–265.

"Parametric Study of Temperature Profiles in Chips Joined by Controlled Collapse Techniques", Sevgin Oktay, IBM j. Res. Develop., vol. 13, May 1969, pp. 272–285.

"Reliability of Controlled Collapse Interconnections" K.C. Norris and A. H. Landzberg, IBM j. Res. Develop., vol. 13, May 1969, pp. 266–271.

"SLT Device Metalllurgy and its Monolithic Extension", P.A. Totta and R.P. Sopher, IBM j. Res. Develop., vol. 13, May 1969, pp. 226–238.

"Studies of the SLT Chip Terminal Metallurgy" B.S. Berry, and I. Ames, IBM j. Res. Develop., vol. 13, May 1969, pp. 286–296.

* cited by examiner

*Primary Examiner*—Jasmine J B Clark
(74) *Attorney, Agent, or Firm*—Michael K. Skrehot; Wade James Brady, III; Frederick J. Telecky, Jr.

(57) ABSTRACT

An integrated circuit (IC) chip has a metal network of electrical power distribution lines which have a thermal conductance at least an order of magnitude greater than underlying thin film electrical interconnects. These lines are deposited on the surface of the chip (FIG. 2), located directly over active IC components, and electrically and thermally connected vertically to selected active components below the lines. Electrical conductors are operable to connect the lines to an outside source, and additional electrically non-functional conductors are distributed on the lines, operable to steepen the thermal gradient for thermal flux away from said active components and lines.

24 Claims, 2 Drawing Sheets

THERMALLY ENHANCED SEMICONDUCTOR CHIP HAVING INTEGRATED BONDS OVER ACTIVE CIRCUITS

This application claims the benefit of Provisional Application Ser. No. 60/246,081 filed Nov. 3, 2000.

FIELD OF THE INVENTION

The present invention is related in general to the field of semiconductor devices and processes and more specifically to thermally enhanced configurations of semiconductor chips having bonds over active circuits and to a method of fabricating these configurations using power distributions integrated into the chip surface.

DESCRIPTION OF THE RELATED ART

Removing the thermal heat generated by active components belongs to the most fundamental challenges in integrated circuit technology. Coupled with the ever shrinking component feature sizes and increasing density of device integration is an ever increasing density of power and thermal energy generation. In order, however, to keep the active components at their optimum (low) operating temperatures and speed, this heat must continuously be dissipated and removed to outside heat sinks. This effort, unfortunately, becomes increasingly harder, the higher the energy density becomes.

In known technology, the most effective approach to heat removal focuses on thermal transport through the thickness of the semiconductor chip from the active surface to the passive surface. The passive surface, in turn, is attached to the chip mount pad of a metallic leadframe so that the thermal energy can flow into the chip mount pad of the metallic leadframe. When properly formed, this leadframe can act as a heat spreader to an outside heat sink. In many semiconductor package designs, this implies a leadframe with a portion formed such that this portion protrudes from the plastic device encapsulation; it can thus be directly attached to the outside heat sink. Examples are described in U.S. Pat. No. 5,594,234, issued on Jan. 14, 1997 (Carter et al., "Downset Exposed Die Mount Pad Leadframe and Package") and U.S. Pat. No. 6,072,230, issued on Jun. 6, 2000 (Carter et al., "Bending and Forming Method of Fabricating Exposed Leadframes for Semiconductor Devices").

From a standpoint of thermal efficiency, however, these approaches have several shortcomings. First of all, the heat generated by active components must traverse the macroscopic thickness of the semiconductor chip in order to exit from the chip. The heat then faces the thermal barrier of the attach material (typically a polymer) before it can enter the leadframe. Secondly, a technical solution is missing to remove the heat generated by active components directly from the IC into a metallic heat conductor and heat spreader positioned in microscopic proximity to the active component. The usual approach is to first spread the heat through the macroscopic thickness of the molding material (typically an epoxy filled with inorganic particles, a mediocre thermal conductor) and only then into a metallic heat spreader, usually positioned on the surface of the molded package.

The thermal situation is also difficult in a conventional ball-grid (or land-grid) array package. A BGA package generally includes an IC chip, a multi-layer substrate, and a heat spreader. The chip is generally mounted on the heat spreader using a thermally conductive adhesive, such as an epoxy. The heat spreader provides a low resistance thermal path to dissipate thermal energy, and is thus essential for acceptable thermal performance during device operation, necessary for consistent electrical performance. Further, the heat spreader provides structural and mechanical support by acting as a stiffener, adding rigidity to the BGA package, and may thus be referred to as a heat spreader/stiffener.

In contrast to the advantages of the BGA packages, prevailing solutions in BGA packages have lagged in performance characteristics such as power dissipation and the ability to maintain signal integrity in high speed operation necessary for devices such as high speed digital signal processors (DSP) and mixed signal products (MSP). Electrical performance requirements are driving the need to use multi-layer copper-laminated resin substrates (previously ceramic). For higher speeds, flip chip assembly rather than wire bonding has been introduced. Compared to wire bonding within the same package outline, flip chip assembly offers greatly reduced IR drop to the silicon core circuits; significant reduction of power and ground inductances; moderate improvement of signal inductance; moderate difference in peak noise; and moderate reduction in pulse width degradation. An example for some electrical improvements of BGA packages is described in U.S. patent application Ser. No. 09/645,760, filed Aug. 25, 2000 (James et al., "Ball Grid Array Package having Two Ground Levels").

Until now, however, substantial thermal improvements of BGA packages, both of flip-chip and wire bonded chip assemblies, have been lacking. This is especially true for any low-cost thermal advancement, since any cost-adding technical proposal is contrary to the strong market emphasis on total semiconductor device package cost reduction.

An urgent need has therefore arisen to break this vicious cycle and conceive a concept for a low-cost, thermally improved and electrically high performance BGA package structure. In addition, a general semiconductor package structure is needed which based on fundamental physics and design concepts flexible enough to be applied for different semiconductor product families and a wide spectrum of design and assembly variations. It should not only meet high thermal and electrical performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

In FOURIER's approach to solving the differential equation of thermal conductance, the thermal flux Q per unit of time is equal to the product of thermal conductivity $\lambda$ multiplied by the gradient of temperature T, in the direction of decreasing temperature, and by the area q perpendicular to the-temperature gradient:

$$dQ/dt = -\lambda \cdot (\text{grad } T) \cdot q,$$

where Q is the vector (in magnitude and direction) of thermal flux, and $\lambda$ is the thermal conductivity, a materials characteristic. The thermal flux is in the direction of the temperature difference and is proportional to the magnitude of that difference.

When, over the length l, the temperature drop is steady and uniform from the high temperature T2 to the low temperature T1, then (grad T) reduces to (T2−T1)/l:

$$dQ/dt = -\lambda \cdot (q/l) \cdot (T2-T1).$$

λ·(q/l) is called the thermal conductance, and the inverse value 1/(λ·q) is called thermal resistance (in analogy to OHM's law).

In the present invention, improvements of both λ·q and (grad T) are simultaneously provided to enhance the thermal flux vertically away from the heat-generating active components on the active surface of the semiconductor chip.

In addition to this enhanced thermal flux vertically away from the active chip surface, there is the traditional possibility of conducting thermal energy in the opposite direction through the semiconductor material of the chip to its passive surface and beyond into leadframes or other substrates.

The present invention thus provides for optimized thermal performance of integrated circuits, solving one of the most intractable limitations of semiconductor technology.

An integrated circuit (IC) chip has a metal network of electrical power distribution lines which have a thermal conductance at least an order of magnitude greater than underlying thin film electrical interconnects. These lines are deposited on the surface of the chip, located directly over active IC components, and electrically and thermally connected vertically to selected active components below the lines. Electrical conductors are operable to connect the lines to an outside source, and additional electrically non-functional conductors are distributed on the lines, operable to steepen the thermal gradient for thermal flux away from said active components and lines.

The patterned network of bondable and/or solderable metal lines, deposited directly on the IC protective overcoat, provides a number of significant advantages.

The network provides an effective heat-spreader directly over, and close by, the heat-generating IC components.

The network relocates most of the conventional power distribution interconnections from the circuit level to the newly created surface network, thus saving substantial amounts of silicon real estate and permitting shrinkage of the IC area.

The network is electrically and thermally connected vertically to selected active components by metal-filled vias; since these vias can easily be redesigned to other locations, IC designers gain a new degree of design freedom.

The network is deposited and patterned in wafer processing as a sequence of metal layers specifically suited for high thermal conductivity and providing power current and electrical ground potential.

As preferred embodiments of the invention, the lines of the network, with attachable outermost surface, are laid out so that they form pads at locations convenient for attaching "balls" of solder or bonding wires.

The network provides attachment locations for additional, electrically non-functional (thermal-only) solder balls. (or wire bonds) directly over IC portions of especially high heat generation, thus creating a short path of steepened temperature gradient dissipating the heat flux away from these high-temperature IC portions to (outside) heat sinks.

The network relocates most of the bond pads dedicated to power supply from the conventional alignment along the chip periphery onto the newly created bondable lines, saving substantial additional amounts of silicon real estate, and freeing the bonding machines from their extremely tight connector placement and attachment rules to much more relaxed bonding programs.

In a preferred embodiment of the invention, the chip of a semiconductor device has an integrated circuit fabricated on the first chip surface ("active" surface); the circuit comprises active components, at least one metal layer, and a protection by a mechanically strong, electrically insulating overcoat which has a plurality of metal-filled vias to contact said at least one metal layer, and a plurality of windows to expose circuit contact pads. The chip further has a stack of electrically conductive films deposited on the overcoat; the films are patterned into a network of lines substantially vertically over the active components. The stack has a bottom-most film in contact with the vias, at least one stress-absorbing film, and an outermost film which is non-corrodible and metallurgically attachable. The network is patterned to spread thermal energy and distribute power current and ground potential.

Electrical conductors (for example, solder balls) are connecting the network lines to an outside electrical source, and additional electrically non-functional (thermal-only) conductors (for example, solder balls) are distributed on the lines for thermal flux away from the lines to an outside heat sink.

In another embodiment of the invention, a plurality of windows is opened in the chip overcoat to expose circuit contact pads. A leadframe is provided, which has a chip mount pad, a first plurality of segments providing electrical power and ground, and a second plurality of segments providing electrical signals. The second ("passive") surface of the chip is attached to the mount pad of the leadframe. Electrical and thermal conductors (for example, bonding wires) connect the network of lines with the first plurality of segments. Electrical conductors (for example, bonding wires) connect the chip contact pads with the second plurality of segments.

It is an aspect of the present invention to reduce the cost of IC chips by reducing the silicon areas consumed by the circuit power distribution lines, as well as by the chip contact pads for power connections.

Another aspect of the invention is to gain a new degree of circuit design flexibility by enabling the power connection to active components in geometrically shortest path and at no penalty for redesign.

Another aspect of the invention is to improve assembly manufacturability by relaxing the tight placement rules for solder bonding and ball attachment in wire bonding.

Another aspect of the present invention is to advance the process and operation reliability of semiconductor probing, and solder-attached and wire bonded assemblies by providing the pad metal layers, and insulating layers separating the contact pad and the circuit, in thicknesses sufficient to reliably absorb mechanical, thermal and impact stresses.

Another aspect of the invention is to eliminate restrictions on the processes of probing and of solder attachment and wire bonding, thus minimizing the risks of inflicting cracking damage even to very brittle circuit dielectrics.

Another aspect of the invention is to provide design and layout concepts and process methods which are flexible so that they can be applied to many families of semiconductor IC products, and are general, so that they can be applied to several generations of products.

Another aspect of the invention is to provide a low-cost and high-speed process for fabrication, testing and assembly.

Another aspect of the invention is to use only design concepts and processes most commonly used and accepted in the fabrication of IC devices, thus avoiding the cost of new capital investment and using the installed fabrication equipment base.

These aspects have been achieved by the teachings of the invention concerning design concepts and process flow suitable for mass production. Various modifications have been successfully employed to satisfy different selections of product geometries and materials.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 08/959,410, filed on Oct. 28, 1997, Ser. No. 09/611,623, filed on Jul. 7, 2000 (Shen et al., "Integrated Circuit with Bonding Layer over Active Circuitry") now U.S. Pat. No. 6,144,100, No. 60/221,051, filed on Jul. 27, 2000 (Efland et al., "Integrated Power Circuits with Distributed Bonding and Current Flow"), TI-31678 (Efland, "Circuit Structure Integrating the Power Distribution Functions, of Circuits and Leadframes into the Chip Surface"), and TI-30955 (Efland et al., "Individualized Low Parasitic Power Distribution Lines Deposited over Active Integrated Circuits"), which are herewith incorporated by reference.

Figure 1:
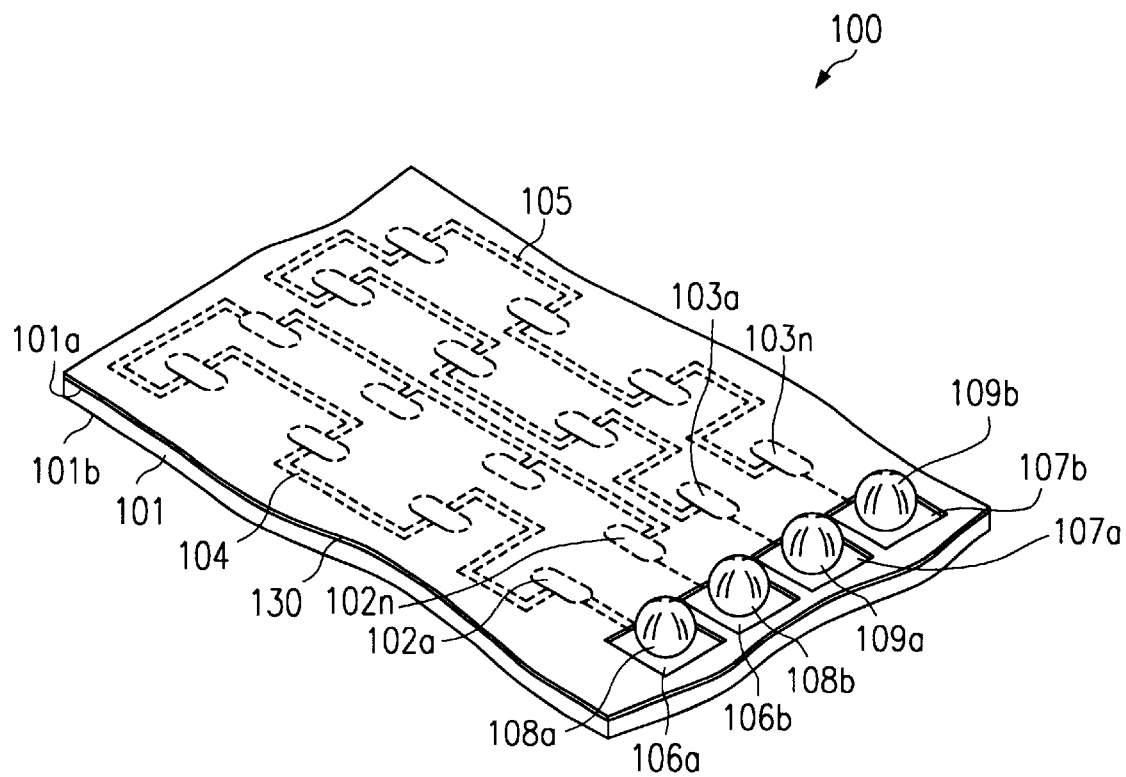
FIG. 1 is a simplified and schematic perspective view of a portion of an integrated circuit chip having solder balls attached to contact pads for connection to outside parts, according to prior art.

The impact of the present invention can be most easily appreciated by highlighting the shortcomings of the known technology. FIG. 1 shows a simplified and schematic perspective view of a portion of an integrated circuit (IC) chip, generally designated 100, with design and fabrication features of the prior art. Semiconductor substrate 101 (usually silicon, between about 225 and 475 $\mu$m thick) has a first ("active") surface 101a and a second ("passive") surface 101b. The second surface 101b may be attached to a substrate (not shown in FIG. 1). Selected from the plurality of solder "balls" (usually 14 to over 600), intended as flip-chip contacts to outside parts, FIG. 1 depicts only the balls 108a, 108b, 109a, and 109b.

As defined herein, the term solder "ball" does not necessarily imply that the solder contacts are necessarily spherical. They may have various forms, such as semispherical, half-dome, truncated cone, or generally bump. The exact shape is a function of the deposition technique (such as evaporation, plating, or prefabricated units), reflow technique (such as infrared or radiant heat), and material composition. Solder balls may be selected from a group consisting of pure tin, tin alloys including tin/copper, tin/indium, tin/silver, tin/bismuth, tin/lead, and conductive adhesive compounds.

For successful metallurgical attachment of the solder balls, the contact pads have to receive special metallization. Structure and preparation of metallization and solder, as well as reliability aspects of the contacts, have been described in numerous publications, most notably the trail-blazing set of papers in the IBM J. Res. Develop., vol. 13, pp. 226–296, 1969: 226–296): P. A. Totta et al., "SLT Device Metallurgy and its Monolithic Extension", L. F. Miller, "Controlled Collapse Reflow Chip Joining", L. S. Goldmann, "Geometric Optimization of Controlled Collapse Interconnections", K. C. Norris et al., "Reliability of Controlled Collapse Interconnections", S. Oktay, "Parametric Study of Temperature Profiles in Chips Joined by Controlled Collapse Techniques", B. S. Berry et al., "Studies of the SLT Chip Terminal Metallurgy".

Embedded in the first surface 101a of, the chip is a plurality of active components of the IC (in modern ICs, the number of active components is large, often in excess of one million, yet miniaturized in lateral and vertical dimensions). Further included in surface 101a is at least one metallization layer (usually pure or alloyed aluminum, between 0.4 and 1.5 $\mu$m thick; in some ICs, there is a hierarchy of six or more metallization layers). The metal is patterned in lines connecting the active and passive components and contact pads of the IC. For metal lines conducting the electrical power, the line width typically ranges from about 20 to 250 $\mu$m. Schematically depicted in FIG. 1 is a small portion of the metallization, patterned as the layout for meandering lines distributing electrical power between active components and contact pads.

For illustration purposes, the active components depicted in FIG. 1 are grouped into two separate electrical loops. One loop comprises the active components designated 102a through 102n; the other loop comprises the active components 103a through 103n. The interconnecting power lines 104 and 105 are organizing the two loops, respectively. Loop 104 has two terminals 106a and 106b, which are fabricated as contact pads suitable for electrical conductors to connect the contact pads with outside parts, especially power supplies. Dependent on the device of the types most frequently produced, the number of contact pads per chip may vary from 14 and more than 600. In FIG. 1, solder balls are chosen as the means for electrical interconnection. Another option includes bonding wires or ribbons (usually gold wires, about 20 to 28 $\mu$m diameter); this option is discussed in FIG. 3. Balls 108a and 108b in FIG. 1 are attached to contact pads 106a and 106b, respectively. Similarly, loop 105 has two terminals 107a and 107b, which also are fabricated as contact pads for solder balls. Balls 109a and 109b are attached to contact pads 107a and 107b, respectively.

As indicated in FIG. 1, the first surface 101a of the semiconductor substrate 101 is uniformly covered with a protective overcoat 130. The contact pads 106a, 106b etc. are opened as windows in this overcoat. Typically, the overcoat is between 0.8 and 1.2 $\mu$m thick, mechanically strong, electrically insulating, and usually moisture-impenetrable; preferred materials include silicon nitride and silicon oxy-nitride.

For operating the signal inputs/outputs of the IC, additional windows in the protective overcoat are needed to expose the underlying contact pad metallization. These windows and their respective solder ball contacts are not shown in FIG. 1.

As can be deduced from FIG. 1, there are a number of problems and limitations, which the known technology imposes on thermal effectiveness, IC and device design, fabrication processes, and product manufacturability.

Placing the solder balls far from the heat-generating active components is very ineffective for IC heat spreading and heat removal.

Having vertically over the heat-generating active components only the chip overcoat, which is a thermal barrier, and then, dependent on the device type, molding compound, underfill, or ambient, which are poor thermal conductors, is very ineffective for IC heat spreading and heat removal.

Placing the power input/output terminals around the chip periphery necessitates the current difficulties
to interconnect active circuit components by lengthy electrical power lines;
to compensate for unavoidable voltage drops along the power distribution lines;
to accept inflexible design rules for positioning active IC components; and
to accept loss of precious silicon real estate.

Placing a high number of bond pads around the chip periphery consumes precious silicon real estate.

Figure 2:
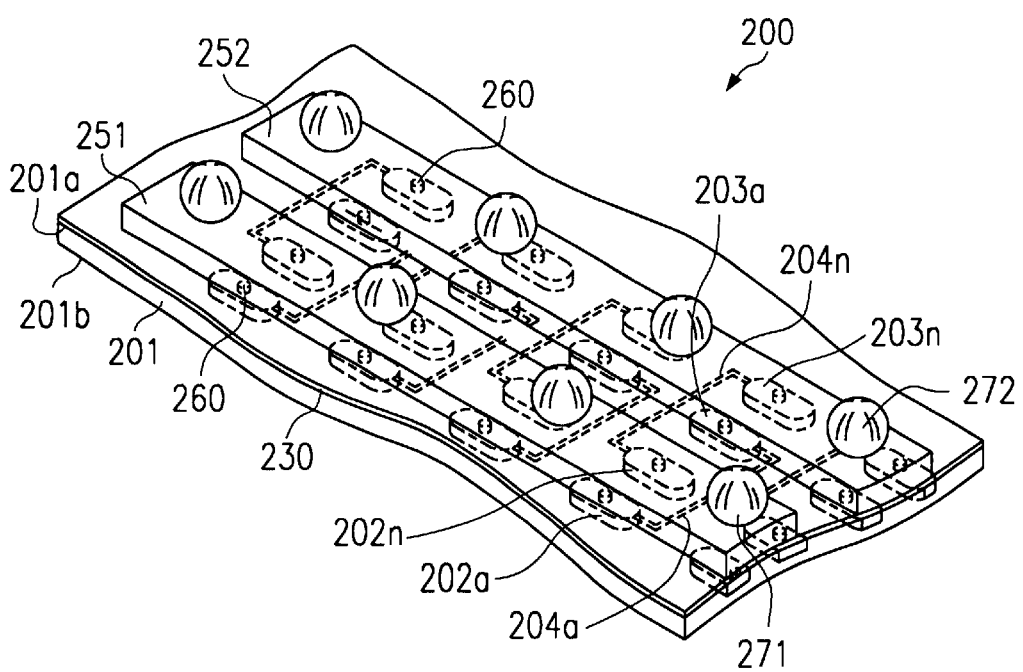
FIG. 2 is a simplified and schematic perspective view of a portion of an integrated circuit chip having a deposited surface structure and means for connecting the structure to an outside heat sink, according to the invention.

FIG. 2 summarizes the innovations of the present invention in order to remedy the above-listed shortcomings of the known technology. FIG. 2 is a simplified and schematic perspective view of a portion of an IC chip, generally designated 200, with design and fabrication features disclosed by the present invention. Semiconductor substrate 201 has a first ("active") surface 201a and a second ("passive") surface 201b. The second surface 201b may be attached to a substrate (not shown in FIG. 2).

Embedded in the first surface 201a of the chip is a plurality of active components of the IC (in modern ICs, the number of active components is large, often in excess of one million, yet miniaturized in lateral and vertical dimensions). According to this invention, the active components 202a through 202n and 203a through 203n shown in FIG. 2 are organized according to the power supply they share, to the extent the IC functions permit this. All active components 202a through 202n share one power current terminal (for instance, the input terminal), all active components 203a through 203n share the other terminal (for instance, the output terminal). In FIG. 2, the power current flows from component 202a to component 203a, . . . , and from component 202n to component 203n. The interconnecting lines are indicated in FIG. 2 by dashed contours. For example, the interconnection from active component 202a to active component 203a is designated 204a; . . . ; the interconnection from active component 202n to component 203n is designated 204n.

As indicated in FIG. 2, the first surface 201a of the semiconductor substrate 201, and thus the IC embedded in this surface, is uniformly covered with a protective overcoat 230. Preferably, the vercoat is between 0.4 and 1.5 $\mu$m thick, mechanically strong, electrically insulating, and impenetrable for moisture. Preferred materials include silicon nitride, silicon oxy-nitride, silicon carbon alloys and sandwiched films thereof. In some applications, a polyimide layer can be used.

It is pivotally important for the present invention that the network of thermal dissipation and power distribution lines is deposited on the exposed surface of the protective overcoat 230, located directly and substantially vertically over the active components of the IC. As a consequence, the metallic lines are integrated on the active surface 201a of the IC chip. In FIG. 2, one of the thermal dissipation and power distribution lines shown is designated 251, another one shown is designated 252. The material structure and composition, as well as fabrication process are described below. The metallic lines 251 and 252 have a thermal conductance at least an order of magnitude greater than underlying thin film metal interconnects (such as 204a, . . . , 204n).

Furthermore, it is crucially important for the present invention that selected active components below the power distribution lines are (thermally and electrically) conductively and vertically connected to the power lines. Preferably, this connection is provided by metal-filled vias 260 which are in contact with the metallization of the active components and with the thermal and power distribution lines. The vias 260 are formed by patterning and etching the overcoat 230, using standard photolithographic techniques. The vias are then filled with metal in conjunction with the deposition of the power line metallization described below.

Figure 3:
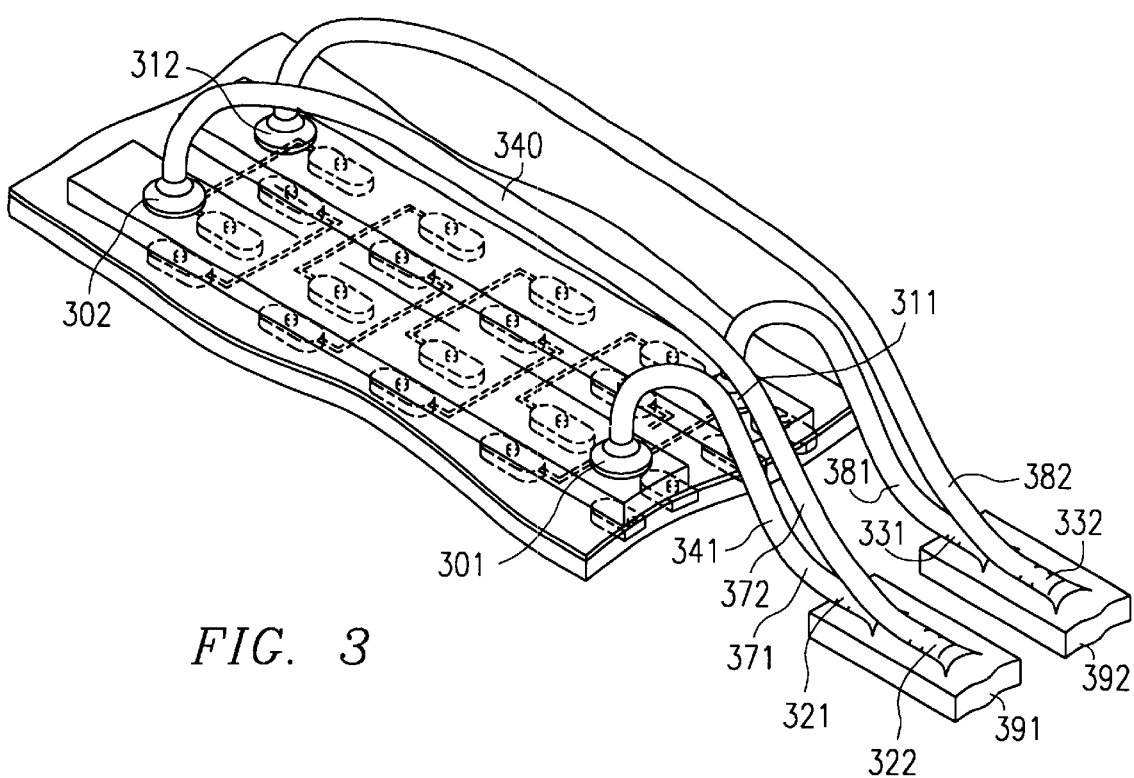
FIG. 3 is a simplified and schematic perspective view of a portion of an integrated circuit chip having bonding wires attached to a surface structure integrating the power distribution functions of circuit and leadframe, according to the invention.

The outermost metal of the deposited lines 251 and 252 is selected from a material which is bondable (and solderable, see below). Electrical conductors connect this outermost metal with external power supply, and additional thermal (electrically non-functional) conductors connect this outermost metal with an outside heat sink. In FIG. 2, solder balls are chosen as the preferred technique for electrical and thermal interconnection. In FIG. 3, wire bonding is the chosen technique (the wire is preferably pure or alloyed gold, copper, or aluminum with a diameter of about 20 to 30 $\mu$m).

It is pivotally important for the present invention that the position of the conductors is selected to enhance dissipation of thermal energy released from the active components below the conductors. This means, the lines and the connecting conductors are positioned to steepen the temperature gradient for thermal flux from one or more selected active components to the corresponding line and sink, to which the thermal flux is to be delivered. In FIG. 2, a plurality of solder balls 271, 272, . . . are shown, attached to lines 251 and 252. While some serve electrical connections, others are electrically non-functional and positioned approximately vertically above active IC components, which are connected to the lines by metal-filled vias. This geometrically shortest connection provides a steep temperature gradient from the active component to the heat sink. The connection is furthermore made of metal of high thermal conductivity.

In order to optimize the thermal enhancement of IC chips having integrated bonds over active IC components, the following improvements are provided simultaneously:
metallic lines are deposited on the active chip surface, and thus integrated on the active surface, which have a thermal conductance at least an order of magnitude greater than underlying thin film electrical interconnects prevalent in the IC;
solder balls (or bonding wires or ribbons) are connecting the lines to an outside heat sink;
the lines and the solder balls are positioned to steepen the temperature gradient for thermal flux from one or more selected active component to the corresponding line and the sink, to which the flux is to be delivered.

In FIG. 3, bonding wires 371 and 372, and 381 and 382 are employed to provide electrical as well as thermal connections. Wire balls 301 and 302, and 311 and 312 are attached to lines 251 and 252, respectively, and stitches 321 and 322, and 331 and 332 are attached to outside parts (lead tips of leadframes, or heat sinks) 391 and 392, respectively. It is important for the present invention that recent technical advances in wire bonding now allow the formation of tightly controlled wire loops and loop shapes. By way of example, loop 340 in FIG. 3 is shown much more elongated than loop 341. Wire lengths of 7.5 mm or even more are achievable with today's bonders. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. For instance, rounded, trapezoidal, linear and customized loop paths can be formed. In general, though, wire loops are held to less than 2 or 3 mm in order to avoid risks of sagging or wire sweep.

The preferred structure of the deposited power distribution metallization for lines 251 and 252 in FIG. 2 consists of a seed metal layer attached to the protective overcoat 230 and the bottoms of the vias 260, followed by a first relatively thin stress-absorbing metal layer, a second, relatively thick stress absorbing layer, and finally an outermost bondable metal layer. Preferably, the seed metal layer is selected from a group consisting of tungsten, titanium, titanium nitride, molybdenum, chromium, and alloys thereof. The seed metal layer is electrically conductive, provides adhesion to both the metallization of the IC active components and the protective overcoat, permits the exposed portions of its upper surface to be electroplated, and prevents migration of the subsequent stress-absorbing metals to the components metallization layers. The thickness of seed metal layer is between about 100 and 500 nm. Alternatively, the seed metal layer may be composed of two metal layers; an example for the second metal is copper, since it provides a suitable surface for subsequent electroplating.

It should be pointed out for the present invention that a single seed layer can preferably be made of refractory metal which has a thickness large enough to reliably act as a stress-absorbing buffer. Thicknesses between about 200 and 500 nm, preferably about 300 nm, are satisfactory. The thickness for optimum stress absorption depends not only on the selected metal, but also on the deposition technique selected, the rate of deposition, and the temperature of the silicon substrate during the time of deposition, since these parameters determine the microcrystallinity of the deposited layer. It has been found, for instance, that when using sputter deposition of tungsten, the layer formation is preferably performed at a rate of about 4 to 5 nm/s onto a silicon substrate at ambient temperature, increasing to about 70° C. when a thickness of at least 300 nm is reached. The tungsten microcrystals thus created have an average size and distribution such that they act reliably as stress-absorbing "springs" during the wire bonding process in assembly.

For depositing the stress-absorbing layers, it is advantageous to employ an electroplating process. An example for the first stress-absorbing metal layer is copper. Its thickness in the range from about 2 to 35 µm makes it a mechanically strong support layer for subsequent attachment of connecting conductors such as bonding wires. An example for the second stress-absorbing metal layer is nickel in the thickness range from bout 1 to 5 µm.

The outermost layer is metallurgically bondable and/or solderable. If soldering is the connecting method selected (as shown in FIG. 2) and the outermost layer should be solderable, favorable metal choices include palladium, gold, silver and platinum and/or solderable. If wire bonding is the connecting method selected (as shown in FIG. 3) and the outermost layer should be bondable, favorable metal choices include pure or alloyed aluminum, gold, palladium, and silver. In both cases, the thickness is in the 500 to 2800 nm range. It is understood that the number of layers, the choice of materials and their thicknesses, and the deposition processes can be varied in order to suit specific device needs.

The plating pattern of the network or distribution lines may form any desired layout. As can be seen in the examples of FIGS. 2 and 3, the connector line pattern may have an elongated or linear form. It is its function, however, to extend vertically over the vias to the component metallization. Otherwise, it may extend geometrically beyond the direct area of the vias and expand, for instance, into a widened part offering sufficient surface area for accommodating extra large-diameter bonding wire or solder balls. Those attachment "pads" may then be equally well suited for attaching a solder ball, wedge bond or a stitch bond.

As pointed out above, the outermost line layer may be selected so that it is solderable. A solder ball can then be attached to it by standard reflow techniques. However, it was described in the above-cited U.S. patent application Ser. No. 09/611,623 and No. 60/221,051 that it is often advisable to employ an additional solder mask or polyimide layer with an opening for each solder ball in order to keep the flip-chip bump in a defined area and shape during bump formation and subsequent attachment to an external package or board.

For operating the signal inputs/outputs of the IC, additional windows in the protective overcoat are needed to expose the underlying contact pad metallization. Wire bond or solder balls can then be affixed to these contact windows. These windows and their respective wire bonds are not shown in FIGS. 2 and 3.

It should further be mentioned that at least some lines and portions of the distribution network deposited over the protective overcoat may be patterned and dedicated to provide distribution for electrical ground potential.

OTHER EMBODIMENTS

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers integrated circuits made in substrates of silicon, silicon germanium, gallium arsenide, or any other semiconductor material used in integrated circuit manufacture.

As another example, the invention covers generally a semiconductor integrated circuit which comprises a circuit structure integrating into the IC chip surface the primary thermal dissipation function of the circuit even when the heat generation in the IC is non-uniform. The position of the power distribution lines and the thermal connections to an outside heat sink are selected so that they maximize thermal conductance as well as temperature gradient simultaneously, even if this may result in a non-uniform distribution of the thermal connections (for instance, solder balls).

It is therefore intended that the appended claims encompass any such modifications or embodiments.

I claim:

1. An integrated circuit chip having active components on its active surface, comprising:

electrically non-functional metallic thermal conductors integrated on said active surface of said chip, and thermally conductively connected to one of said active components; and the position of said conductors selected to enhance dissipation of thermal energy released from said active components below said conductors.

2. An integrated circuit chip having active components on its active surface, comprising:

metallic lines having a thermal conductance at least an order of magnitude greater than underlying thin film electrical interconnects, integrated on said active surface;

means for connecting said lines to an outside heat sink; and said lines and said connecting means positioned to steepen the temperature gradient for thermal flux from one or more selected active components to the corresponding line and said sink, to which said flux is to be delivered.

3. An integrated circuit chip having active components on its active surface, comprising:

a metal network of electrical power distribution lines, said lines having a thermal conductance at least an order of magnitude greater than underlying thin film electrical interconnects, deposited on the surface of said chip, located directly over said active components;

said lines electrically and thermally connected vertically to selected active components below said lines;

electrical conductors operable to connect said lines to an outside source; and additional, electrically non-functional conductors distributed on said lines, operable to steepen the temperature gradient for thermal flux away from said active components and lines.

4. A semiconductor device having an additional conductor network on the chip surface, comprising:

a semiconductor chip having first and second surfaces;

an integrated circuit fabricated on said first chip surface, said circuit having active components, at least one metal layer, and being protected by a mechanically strong, electrically insulating overcoat having a plurality of metal-filled vias to contact said at least one metal layer;

conductive films deposited on said overcoat and patterned into a network of lines substantially vertically over said active components, said films in contact with said vias and having at least one stress-absorbing film and an outermost film being non-corrodible and metallurgically attachable;

said network patterned to spread thermal energy and distribute electrical power current and ground potential;

electrical conductors connecting said network lines to an outside electrical source; and additional thermal-only conductors distributed on said lines for thermal flux away from said lines to an outside heat sink.

5. The device according to claim 4 further comprising:

a plurality of windows opened in said chip overcoat to expose circuit contact pads;

a leadframe having a chip mount pad, a first plurality of segments providing electrical power and ground and a second plurality of segments providing electrical signals;

said second chip surface attached to said chip mount pad;

electrical and thermal conductors connecting said network lines with said first plurality of segments; and electrical conductors connecting said chip contact pads with said second plurality of segments.

6. The device according to claim 4 further comprising:

a substrate having a plurality of bondable and solderable electrical contact pads;

a heat sink integral with said substrate, said sink thermally connected to said contact pads; and electrical and thermal conductors connecting said chip network lines and said substrate contact pads.

7. The device according to claim 4 wherein said chip is selected from a group consisting of silicon, silicon germanium, gallium arsenide, and any other semiconductor material customarily used in electronic device fabrication.

8. The device according to claim 4 wherein said circuit comprises a plurality of active and passive electronic components arranged horizontally and vertically.

9. The device according to claim 4 wherein said integrated circuit comprises multi-layer metallization, at least one of said layers made of pure or alloyed copper, aluminum, nickel, or refractory metals.

10. The device according to claim 4 wherein said overcoat comprises materials selected from a group consisting of silicon nitride, silicon oxynitride, silicon carbon alloys, polyimide, and sandwiched films thereof.

11. The device according to claim 4 wherein said conductive films comprise at least one stress-absorbing metal layer selected from a group consisting of copper, nickel, aluminum, tungsten, titanium, molybdenum, chromium, and alloys thereof.

12. The device according to claim 4 wherein said outermost metal layer is selected from a group consisting of pure or alloyed gold, palladium, silver, platinum, and aluminum.

13. The device according to claim 4 wherein said network of lines, together with said metal-filled vias, provides the power distribution function between said active circuit components.

14. The device according to claim 5 wherein said electrical and thermal conductors are bonding wires or ribbons.

15. The device according to claim 5 wherein said leadframe is pre-fabricated from a sheet-like material selected from a group consisting of copper, copper alloy, aluminum, iron-nickel alloy, or invar.

16. The device according to claim 14 further comprising an encapsulation enclosing said chip, chip mount pad, electrical conductors, and at least portions of said first and second plurality of leadframe segments.

17. The device according to claim 6 wherein said electrical and thermal conductors are solder balls or bumps.

18. The device according to claim 14 wherein said bonding wire is selected from a group consisting of pure or alloyed gold, copper, and aluminum.

19. The device according to claim 17 wherein said solder ball is selected from a group consisting of pure tin, tin alloys including tin/copper, tin/indium, tin/silver, tin/bismuth, tin/lead, and conductive adhesive compounds.

20. The device according to claim 16 wherein said encapsulation comprises a transfer molding process using a polymer compound with thermally conductive fillers.

21. A semiconductor device, comprising:

an integrated circuit chip having a front surface including active devices connected by lines having a first thermal conductivity;

a protective overcoat over said front surface of said chip;

lines on said protective overcoat having a second thermal conductivity, wherein said second thermal conductivity is higher than said first thermal conductivity, and further wherein said lines are positioned over said active devices and are connected to said active devices through said protective overcoat.

22. The semiconductor device of claim 21, wherein said lines on said protective overcoat and said lines connecting said active devices are made of different materials.

23. The semiconductor device of claim 21, wherein said lines on said protective overcoat are thicker than said lines connecting said active devices.

24. The semiconductor device of claim 21, wherein said lines on said protective overcoat comprise at least three metals.

* * * * *